United States Patent
Riechert et al.

(10) Patent No.: US 7,088,753 B2
(45) Date of Patent: Aug. 8, 2006

(54) SEMICONDUCTOR LASER STRUCTURE

(75) Inventors: Henning Riechert, Ottobrunn (DE);
Anton Yurevitch Egorov, St. Petersburg (RU)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/181,854

(22) PCT Filed: Dec. 4, 2000

(86) PCT No.: PCT/DE00/04317

§ 371 (c)(1),
(2), (4) Date: Feb. 21, 2003

(87) PCT Pub. No.: WO01/52373

PCT Pub. Date: Jul. 19, 2001

(65) Prior Publication Data

US 2003/0179792 A1    Sep. 25, 2003

(30) Foreign Application Priority Data

Jan. 13, 2000    (DE)    ................................. 100 01 122

(51) Int. Cl.
*H01S 5/00* (2006.01)
(52) U.S. Cl. .......................................... 372/43; 372/45
(58) Field of Classification Search .................. 372/43, 372/45, 50
See application file for complete search history.

(56) References Cited

U.S. PATENT DOCUMENTS

| 5,060,028 A | 10/1991 | Kuo et al. | |
|---|---|---|---|
| 5,204,284 A | 4/1993 | Kuo et al. | |
| 5,689,123 A | 11/1997 | Major et al. | ................. 257/190 |
| 5,719,894 A | 2/1998 | Jewell et al. | ................. 372/145 |
| 5,786,603 A * | 7/1998 | Rennie et al. | ................. 257/13 |
| 5,825,796 A | 10/1998 | Jewell et al. | ................. 372/145 |
| 5,904,549 A | 5/1999 | Sato | |
| 5,943,357 A * | 8/1999 | Lebby et al. | .................. 372/50 |
| 6,046,096 A * | 4/2000 | Ouchi | .......................... 438/510 |
| 6,121,638 A * | 9/2000 | Rennie et al. | .............. 257/103 |
| 6,240,114 B1 * | 5/2001 | Anselm et al. | ................. 372/45 |
| 6,265,287 B1 * | 7/2001 | Tsujimura et al. | ........... 438/478 |

(Continued)

FOREIGN PATENT DOCUMENTS

EP    0 896 406 A2    2/1999

(Continued)

OTHER PUBLICATIONS

Miyamoto, T. et al., A novel GaInNAs-GaAs Quantum-Well Structure for long-wave semiconductor lasers. In: IEEE Photonics Technology Letters, vol. 9. No. 11, pp. 1448-1450, 1997.

(Continued)

*Primary Examiner*—Trinh Vo Dinh
*Assistant Examiner*—Hung Tran Vy
(74) *Attorney, Agent, or Firm*—Altera Law Group, LLC; Jeffrey R. Stone

(57) ABSTRACT

The active layer (1) and the barrier layers (2) contain a group III component, a group V component and nitrogen, whereby the active layer is a quaternary material and the barrier layers are ternary materials, or, in order to match the lattice properties of the active layer to the barrier layers, the nitrogen content in the barrier layers is higher. The active layer is preferably InGaAsN, the barrier layers are InGaAsN with higher nitrogen content or GaAsN. Superlattices may exist in the barrier layers, for example, series of thin layers of $In_xGa_{1-x}As_yN_{1-y}$ with varying factors x and y, where, in particular, x=0 and y=1.

1 Claim, 1 Drawing Sheet

U.S. PATENT DOCUMENTS

| | | | |
|---|---|---|---|
| 6,359,292 B1 * | 3/2002 | Sugawara et al. | 257/103 |
| 6,472,680 B1 * | 10/2002 | Takayama et al. | 257/14 |
| 6,541,297 B1 * | 4/2003 | Takahashi | 438/31 |
| 2003/0123511 A1 * | 7/2003 | Johnson | 372/96 |
| 2004/0135136 A1 * | 7/2004 | Takahashi et al. | 257/14 |

FOREIGN PATENT DOCUMENTS

| | | |
|---|---|---|
| EP | 0621 646 B1 | 7/1999 |
| EP | 0621 646 * | 10/1999 |
| JP | 01168256/1989 | 7/1989 |
| JP | 07-99370/1995 | 4/1995 |
| JP | 08195522/1996 | 7/1996 |
| JP | 09283857/1997 | 10/1997 |
| JP | 11112096/1999 | 4/1999 |
| JP | 11284282/1999 | 10/1999 |
| JP | 11340578/1999 | 12/1999 |

OTHER PUBLICATIONS

Kondow, M., et al., Gas Source MBE of GaInNAs for long-wavelength laser diodes. In: Journal of Crystal Growth, vol., 188, pp. 255-259, 1998.

* cited by examiner

SEMICONDUCTOR LASER STRUCTURE

This application is a 371 of PCT/DE/00/04317 Dec. 4, 2000.

The present invention relates to a semiconductor layer structure which is suitable for fabricating laser diodes.

For radiation emission wavelengths of approximately 1.3 µm, use is usually made of the material InGaAsP, preferably on InP substrates. InGaAs as active layer in heterostructures on GaAs is not suitable for this wavelength range since the band gap (energy band gap) in homogeneous InGaAs layers would require such a high proportion of indium that the layer would become unusable for lasers owing to structural relaxation. It has been demonstrated, however, that heterostructures on GaAs can equally be used, in principle, for longer-wave emission if the emitting material is a potential well (quantum well) made of InGaAsN, GaAs layers usually being used as barrier layers above and below the active layer provided for radiation generation (see e.g. M. Kondow et al.: GaInNAs: A Novel Material for Long-Wavelength Semiconductor Lasers" in IEEE J. Select. Topics Quantum Electron. 3, 719–730 (1997), M. Kondow et al.: "Gas-source MBE of GaInNAs for long-wavelength laser diodes" in J. Crystal Growth 188, 255–259 (1998) and K. Nakahara et al.: "1.3-µm Continuous-Wave Lasing Operation in GaInNAs Quantum-Well Lasers" in IEEE Photon. Technol. Lett. 10, 487–488 (1998)). The publication by T. Miyamoto et al.: "A Novel GaInNAs-GaAs Quantum-Well Structure for Long-Wavelength Semiconductor Lasers" in IEEE Photonics Technology Letters 9, 1448–1450 (1997), describes a semiconductor laser structure in which a QW layer (quantum well) made of $Ga_{0.6}In_{0.4}N_{0.01}As_{0.99}$ provided as active layer is arranged between layers made of $Ga_{0.97}In_{0.03}N_{0.01}As_{0.99}$. EP-A-0,896,406 discloses a semiconductor laser structure having an active layer made of $InN_xAs_yP_{1-x-y}$ ($0<x<1$ and $0 \leq y<1$) between layers made of $GaN_{x'}As_{y'}P_{1-x'-y'}$ ($0<x'<1$ and $0 \leq y'<1$). A semiconductor laser structure having an active layer made of $In_yGa_{1-y}As_{1-w-v}Sb_wN_v$ ($v \leq 0.0095$ and $w+y \geq 0.33$) between layers made of $GaAs_{1-z}P_z$ ($0 \leq z \leq 1$) or $In_yGa_{1-y}As$ ($0.53 \leq y \leq 1$) is disclosed in U.S. Pat. No. 5,719,894 and U.S. Pat. No. 5,825,796.

It is an object of the present invention to specify a semiconductor layer structure which is suitable for fabricating laser diodes and enables efficient radiation emission at wavelengths of 1.3 µm and above.

The semiconductor laser structure according to the invention is based on the insight that the radiation emission in a wavelength range of 1.3 µm and above can be significantly improved if the properties of the barrier layers which bound the active layer provided for radiation generation are set more precisely with regard to the strains and dislocations that occur in the heterostructure. To that end, the layer provided for radiation generation and the barrier layers comprise material compositions which contain a III component, a V component and N (III and V corresponding to the groups of the periodic table). The emission wavelength is set by the nitrogen proportion in the active layer. In one embodiment, the active layer is quaternary material with a proportion of a further III component, and the barrier layers are ternary material; in a further embodiment, the layers are composed of the same chemical elements and differ only in the percentage proportions of these elements (e.g. in each case quaternary material made of the same elements with different atomic proportions), but the nitrogen proportion is higher in the barrier layers than in the active layer. In the case of a preferred exemplary embodiment in the material system of GaAs, both the active layer and the barrier layers comprise Ga, As and N. The active layer is then preferably InGaAsN, the barrier layers are InGaAsN with a higher nitrogen proportion or GaAsN.

Another embodiment comprises superlattices in the barrier layers, which are formed by a sequence of thin layers which each contain a III component, a V component and N in different percentage proportions. In the material system of GaAs, the layers which form the superlattice are e.g. $In_xGa_{1-x}As_yN_{1-y}$ with different proportions x and y, where it may be the case that, in particular, $x=0$ and $y=1$. The compositions of the individual layers are chosen, however, in such a way as to produce the desired proportion of nitrogen or indium overall in the superlattice.

According to the invention, it is possible to achieve, on the one hand, sufficient lattice matching of the grown layers and, on the other hand, a sufficiently large jump in the energy band gap, as a result of which confinement is effected. The barrier material need not necessarily occupy the entire layer thickness of the component above and below the active layer (in the case of a VCSEL, by way of example, the region between the DBR gratings functioning as resonator end mirrors). In the practical embodiment, barrier layers having a thickness of typically 50 nm suffice; outside there may be GaAs, for example as cladding layer. A multistage reduction of the energy band gap in the barrier layers may also be advantageous.

An example of the heterostructure according to the invention is described below with reference to the figures.

In a preferred exemplary embodiment of the invention, the active layer 1 (see FIG. 1) is, made of InGaAsN, and the adjoining barrier layers 2 are made of semiconductor material of the same components, but with a lower indium content and higher nitrogen content. The proportion of indium in the barrier layers can also be completely reduced, so that the barrier layers 2 are GaAsN. The structure of a surface emitting laser diode with a vertical resonator (VCSEL) is illustrated as an example in FIG. 1. In this case, the required laser resonance is generated by upper and lower DBR gratings 3 (distributed Bragg reflection). The arrangement is preferably situated on a substrate 4. Further details of the laser diode which, like the connection contacts, are known per se have been omitted in order to illustrate the parts essential to the invention.

Figure 1:
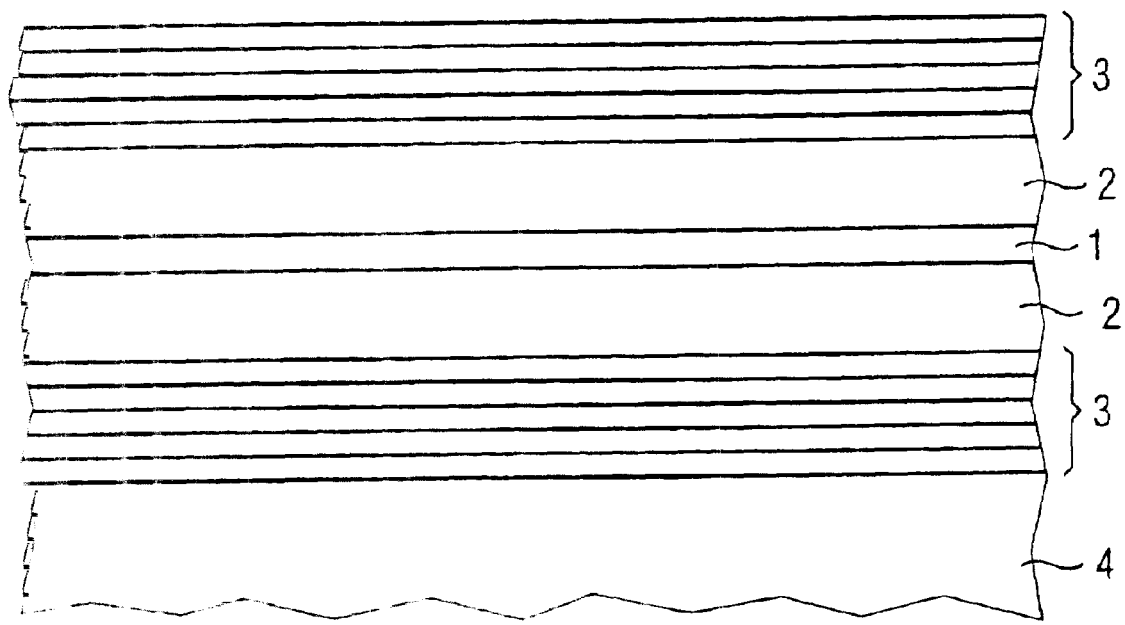
FIG. 1 shows a layer construction in cross section.
Figure 2:
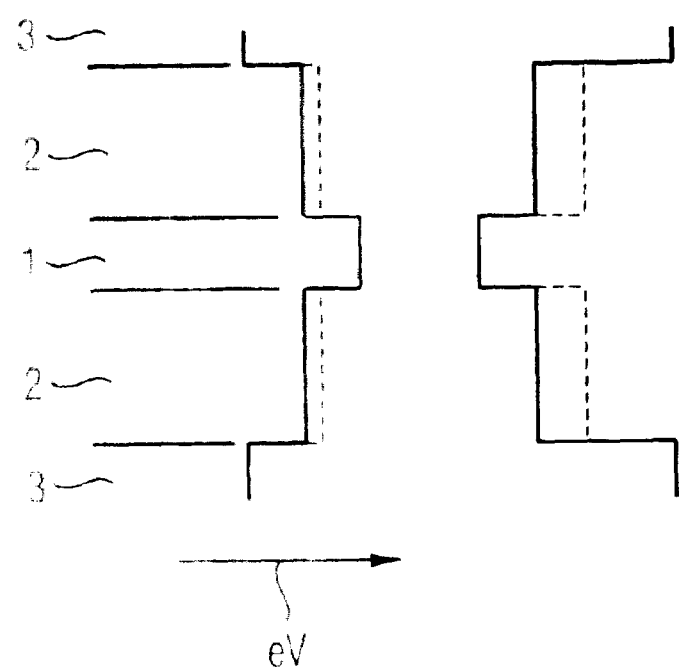
FIG. 2 shows an energy diagram for the layer construction of FIG. 1.

FIG. 2 shows a diagram in which the left-hand side depicts the profile of the upper edge of the valence band and the right-hand side the profile of the lower edge of the conduction band for the layer construction illustrated in FIG. 1. The regions applicable to the active layer 1, the barrier layers 2 and the adjoining gratings 3 are designated by the corresponding numerals. The diagram is not drawn to scale, but shows qualitatively correctly the typical relations of the energy band gaps in the individual layers. It is assumed in this case that the active layer 1 is InGaAsN, and that the barrier layers 2 are likewise InGaAsN but with a reduced indium content compared with the material of the active layer 1. FIG. 2 depicts using broken lines the corresponding curve profiles for the case where the barrier layers 2 are GaAs. It can be seen that when InGaAsN is used for the barrier layers 2, a reduced energy band gap compared with the use of GaAs results in the barrier layers. This reduced energy band gap results, as can be seen in FIG. 2, from the fact that, in the barrier layers 2, the upper edge of the valance band is lowered to a smaller extent than the lower edge of the conduction band.

An alternate embodiment comprises the active layer being made of GaAsSbN, and the barrier layers may be made of GaAsSbN or GaAsN.

In the case of an arrangement of the semiconductor laser structure on GaAs, owing to the smaller lattice constant of InGaAsN compared with GaAs, the active layer is usually subjected to severe compressive strain; this strain could be eliminated in the layer itself only by increasing the nitrogen proportion in this layer to approximately ⅓ of the indium proportion, but that is ruled out owing to the poor results of the optical quality of the component. By virtue of the fact that, in the barrier layers, according to the invention, GaAsN is used or a higher nitrogen proportion than in the active layer is chosen, the barrier layers are strained oppositely to the active layer.

In the material system described, the DBR gratings provided as reflectors can be fabricated in accordance with conventional layer structures in the material system of AlGaAs/AlAs. It is equally possible to provide cladding layers, covering layers or the like made of AlGaAs. What is essential to the layer structure according to the invention is that both the active layer 1 and the barrier layers 2 adjoining it contain nitrogen as material component.

A further configuration of the semiconductor laser structure has superlattices in the barrier layers. The mean lattice constant of the superlattice is preferably less than or equal to that of the substrate material in order to avoid additional straining of the layer structure. The mean energy band gap of the superlattice preferably lies between that of the active layer, which forms the potential well with the barriers, and a cladding layer adjoining the barrier layer in each case on the side remote from said layer. In this case, it must be ensured that an energetic barrier with respect to the active layer is present for all charge carriers, electrons and holes. Suitable superlattices can be formed, to be precise in particular on GaAs as substrate material, e.g. by sequences of layers made of $In_xGa_{1-x}As_yN_{1-y}$ or made of $In_xGa_{1-x}As_yP_{1-y}$ with different percentage atomic proportions x and y or by sequences of layers made of InGaAsN and AlGaAsN, GaAsN or GaAs. Further possibilities are sequences made of InGaAs and GaAsN, GaAsP or InGaP.

The following may be mentioned, in particular, as advantages of the layer structure according to the invention. The strain of the material of the barrier layers 2 can be set in such a way that it at least partly compensates for the generally severely compressive strain of the potential well formed by the active layer between the barrier layers. This enables higher strains of the potential well (and hence larger layer thicknesses or higher indium contents) without structural relaxation occurring. This enables longer-wave radiation emission than with conventional GaAs barriers. By virtue of the smaller energy band gap of the barrier material according to the invention (compared with GaAs barriers), given an otherwise identically structured potential well, the optical transition in the potential well is shifted into the longer-wave, whereby longer-wave radiation emission is likewise achieved. By virtue of the incorporation of nitrogen into the material of the barrier layers, the ratio of the jumps of the energy band gaps at the boundary with respect to the potential well (layer boundary between active layer 1 and barrier layers 2) can be influenced by means of a suitable choice of the percentage proportion of the nitrogen. While the energy band gap in the active layer 1 remains the same, the barrier effect (confinement) is increased by lowering the upper edge of the valance band in the material of the barrier layers. This increases the energetic inclusion of holes and hence the total rate of electron-hole recombinations in the potential well, which increases the efficiency of a laser provided with this heterostructure. Through the choice of the compositions with a higher nitrogen content of the barrier layers or the use of ternary material in the barrier layers and quaternary material in the active layer, a strain of the active layer can be at least partly compensated for in such a way that an efficient radiation yield is achieved even at long wavelengths in the range from 1.3 µm upward.

The invention claimed is:

1. A semiconductor laser structure having an active layer between barrier layers, said active layer being provided for radiation generation, in which the active layer is $In_xGa_{1-x}As_yN_{1-y}$ semiconductor material, and in which the barrier layers are $In_xGa_{1-x}As_yN_{1-y'}$ semiconductor material, and in which the $In_xGa_{1-x}As_yN_{1-y'}$ semiconductor material of the barrier layers has a larger energy band gap than the $In_xGa_{1-x}As_yN_{1-y}$ semiconductor material of the active layer, and in which, for lattice matching of the active layer to the barrier layers, the nitrogen proportion in the barrier layers is higher than the nitrogen proportion in the active layer such that y'<y.

* * * * *

UNITED STATES PATENT AND TRADEMARK OFFICE
CERTIFICATE OF CORRECTION

PATENT NO.       : 7,088,753 B2                              Page 1 of 1
APPLICATION NO.  : 10/181854
DATED            : August 8, 2006
INVENTOR(S)      : Henning Riechert It is certified that error appears in the above-identified patent and that said Letters Patent is hereby corrected as shown below:

On The Title Page Item (30) Foreign Application Priority Data, please delete "100 01 122" and add -- 100 01 122.5 --.

Signed and Sealed this

Sixth Day of November, 2007

JON W. DUDAS
*Director of the United States Patent and Trademark Office*